Aug. 18, 1964 E. W. HENNING 3,145,346

DIRECT-CURRENT AMPLIFIER

Filed March 13, 1961 2 Sheets-Sheet 1

INVENTOR.
EUGENE W. HENNING
BY
A. M. Fernandez
ATTORNEY.

INVENTOR.
EUGENE W. HENNING
BY A. M. Fernandez
ATTORNEY.

United States Patent Office 3,145,346

Patented Aug. 18, 1964

3,145,346

DIRECT-CURRENT AMPLIFIER

Eugene W. Henning, Phoenix, Ariz., assignor to General Electric Company, a corporation of New York Filed Mar. 13, 1961, Ser. No. 95,400
1 Claim. (Cl. 330—9)

Figure 1:
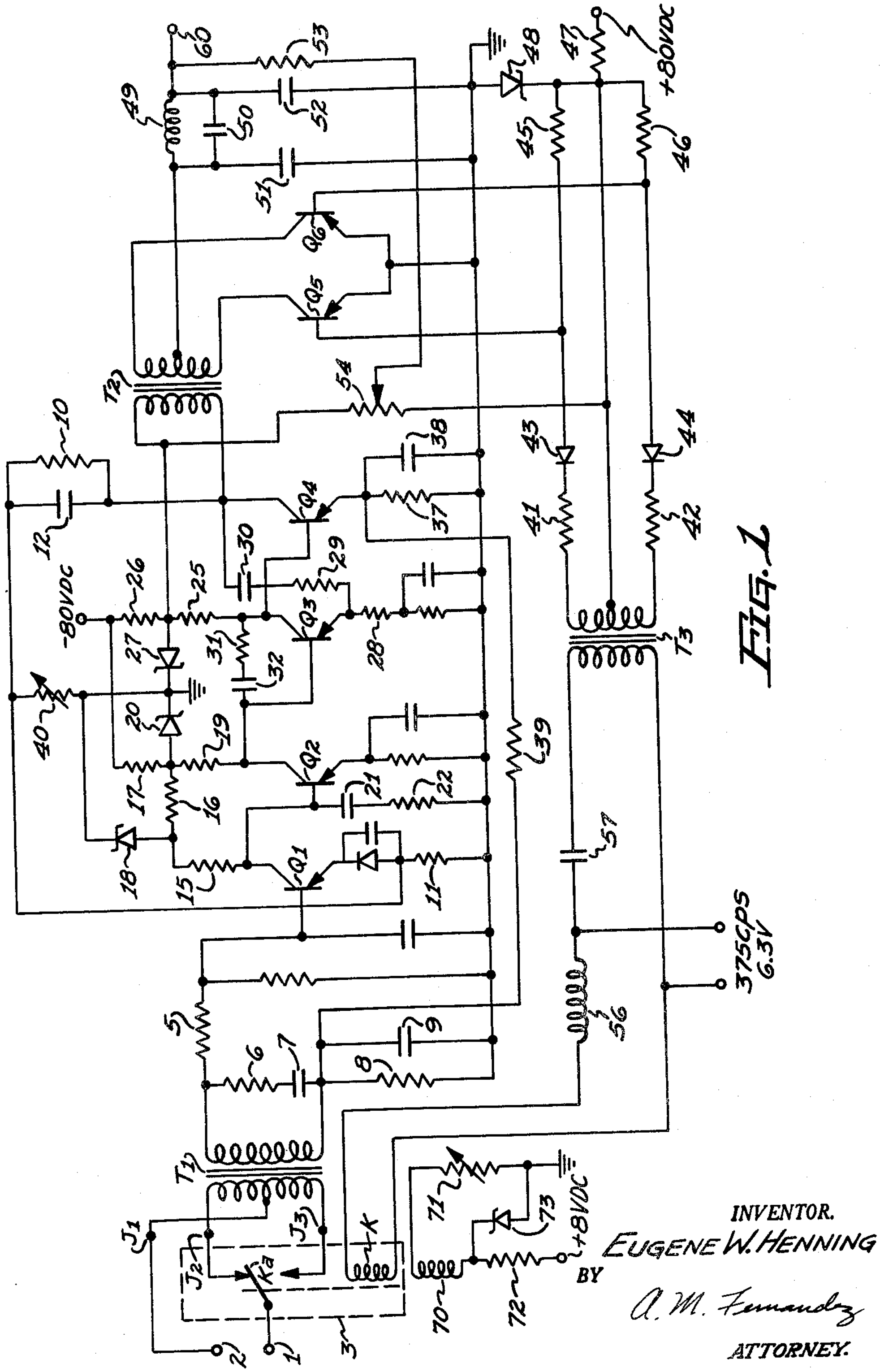

This invention relates to a direct-current amplifier for low-level voltage signals and more particularly to improvements in a low-level differential amplifier of the modulated-carrier type.

Direct-current amplifiers of the modulated-carrier type described by G. A. Korn and D. M. Korn at pages 200 to 202 of Electronic Analog Computers, published by McGraw-Hill Book Co. (1952), have been used extensively in electronic analog computers and process control systems employing sensing devices, such as strain gauges and thermocouples, because of their excellent gain characteristics at low frequencies with virtually no zero drift. The most common modulator employed in a low-level differential amplifier of that type utilizes an electromagnetic vibrator having a transfer contact adapted for vibration between a pair of output contacts in response to a drive coil excited by an alternating current. Modulation of a D.-C. input signal is achieved as the transfer contact alternately engages the two output contacts which may be connected to opposite ends of a center-tapped primary winding of an input transformer.

The essentially square-wave modulated signal coupled into the secondary circuit of the input transformer is amplified by a stable high-gain, A.-C. amplifier which provides a gain of 1,000 or more. The amplified signal is then demodulated to provide the desired amplified D.-C. signal by a demodulator synchronized with the electromagnetic vibrator, hereinafter referred to as a synchronous vibrator.

The use of a synchronous vibrator in a low-level, D.-C. amplifier produces a number of problems at very low signal levels, such as signal levels from 5 to 10 microvolts. First, its use generally requires a balanced center-tapped input transformer and a balanced center-tapped output transformer. It also requires that the synchronous vibrator be made of materials carefully selected in order that the Volta effect which produces contact E.M.F.'s may be minimized. Additional problems are created by the Seebeck effect which produces thermal E.M.F.'s when temperature differences exist between the junctions which connect the synchronous vibrator to the center-tapped input transformer and the junctions which connect the center tap of its primary winding to the signal source or a source of reference potential. Because of these and other problems, the input transformer, the synchronous vibrator, and the connecting leads must be carefully selected and the leads carefully placed in order to provide two input circuits on both sides of the center tap which are substantially balanced with respect to circuit inductances, circuit capacitances, turn ratios and flux linkages.

An A.-C. signal component commonly referred to as a ripple at the frequency of the excitation signal employed to drive the synchronous vibrator may appear in the D.-C. output signal due to imbalances in the inductance as well as imbalances in the distributed capacitance of the two input circuits alternately closed by the synchronous vibrator, the two input circuits including the two halves of the primary winding of the input transformer. An additional imbalance may occur in the two input circuits as they are alternately closed by the transfer contact which moves through a magnetic field if that field is not symmetrical, because an unsymmetrical field will cause an imbalance in the variations of the reluctances in the two input circuits.

To understand the nature of a ripple in the output D.-C. signal, it should be noted that if the two input circuits connecting the synchronous vibrator to the center-tapped input transformer do not have balanced capacitances, inductances and variable reluctances, which affect the inductances, a different voltage amplitude is produced across the secondary winding during each half of a modulating cycle because the instantaneous voltage in a given input circuit is $$v=Ri+L\frac{di}{dt}+\frac{1}{C}\int_0^t idt$$

That familiar differential equation shows that the instantaneous voltage is a function of circuit inductance and capacitance so that the current through each half of the primary winding is not only a function of the circuit resistance which can be readily balanced, but also a function of the inductance and capacitance which cannot be readily balanced. If the inductance and capacitance of the two input circuits are not balanced, the current through the two circuits will be unequal and will cause an imbalance in the amplitude of the signal coupled to the secondary winding of the input transformer during the two halves of a given modulating cycle. Since the input transformer cannot couple a D.-C. signal into its secondary winding, an error in the amplitude of the D.-C. output signal is not produced by an imbalance in the capacitances and inductances of the input circuits; instead, a ripple is produced in the D.-C. output signal.

An imbalance in the dwell time of the transfer output contact on the two contacts of the synchronous vibrator will also produce a ripple in the D.-C. output signal. The reason is that the D.-C. input signal alternately applied to the two input circuits during a given modulating cycle will have unequal time durations. Because of the law concerning the conservation of electrokinetic momentum in the input transformer, there is an induction of equal energy in the secondary winding of the input transformer during both halves of a given modulating cycle. The effect of the dwell-time imbalance on the primary winding is the same as applying positive and negative pulses of equal amplitude but of unequal duration to it and the result in the secondary winding is the induction of positive and negative pulses not only of unequal duration but also of unequal amplitude. After amplification and demodulation, the amplified D.-C. signal is found to contain a ripple (an A.-C. component) having a fundamental frequency which is the same as the frequency of the modulating signal and an amplitude which is a function of the D.-C. input signal. That ripple cannot be filtered out without increasing the response time of the amplifier, a result which may not be permissible in systems requiring fast response for rapid scanning of sensing devices, such as in a system for controlling industrial processes.

An imbalance in the inductances and the capacitances of the two input circuits alternately closed by the synchronous vibrator for modulation produces the same ripple as an imbalance in the dwell times of the transfer contact in the synchronous vibrator because an imbalance in the inductances and capacitances of the input circuits causes dissimilar build-up and decay times for the currents in the two input circuits during the two halves of a modulating cycle. The effect is the same as applying pulses to the primary winding of dissimilar time duration which, because of the law of the conservation of electrokinetic momentum, induced pulses in the secondary winding of the input transformer of unequal duration and amplitude so that after amplification and demodulation, the D.-C. output signal is found to have a ripple, the amplitude of which is a function of the D.-C. input signal.

Similar imbalances in the demodulator produce similar effects; namely, a ripple in the output signal, for analogous reasons. However, the ripple produced by the demodulator may be in phase or out of phase with the ripple produced by the modulator, depending on whether or not imbalances in the demodulator are corresponding in phase with the imbalances in the modulator. Accordingly, if the imbalances in the modulator can be controlled, they can be employed to neutralize any imbalances in the demodulator. Conversely, imbalances in the demodulator may be employed to neutralize any imbalances in the modulator. However, more complete neutralization may be achieved by controlling imbalances in the modulator because imbalances there have a greater effect on the ripple in the output signal due to the gain of the intervening amplifier.

The other sources of error referred to hereinbefore are not a function of the input signal and may therefore be more directly corrected as by adding a suitable zero-offset signal to the D.-C. output signal. For instance, any imbalance in the contact potentials caused by the Volta effect between the contacts alternately closed in the synchronous vibrator introduces a substantially stable D.-C. error signal which is not a function of the D.-C. input signal and may therefore be corrected by introducing a counteracting D.-C. signal. An error signal due to imbalances in thermal potentials caused by the Seebeck effect may be similarly corrected.

An object of this invention is to provide an improved modulator of the synchronous-vibrator type. Still another object is to provide a direct-current amplifier of the modulated-carrier type. More particularly, the object of this invention is to provide a means for reducing the ripple (A.C. signal component) in the D.-C. output signal of a low-level differential amplifier of the type described.

These and other objects of the invention are achieved in a preferred embodiment of the invention by providing an electromagnet in the form of a coil wound around or otherwise placed electromagnetically adjacent to the excitation coil of a synchronous vibrator employed for modulation in a low-level differential amplifier and adjusting the magnitude and direction of a direct current through that coil to provide a magnetic field in the proper direction and of sufficient strength to appropriately bias the transfer contact of the synchronous vibrator until the dwell times of the transfer contact are so adjusted that the effects of any imbalances in the modulator and demodulator are eliminated from the output signal of the low-level differential amplifier. If an A.-C. signal component is present as a ripple in the D.-C. output signal, the cause may be an imbalance in the dwell times of the transfer contact or an imbalance in the inductances and capacitances of the input and output transformer circuits which are alternately closed for modulation and demodulation, or all three. By adjusting the dwell times of the synchronous vibrator employed for modulation, any ripple can be substantially neutralized. If the ripple is due only to an imbalance in the dwell times in the synchronous vibrator, the adjustment of the biasing magnetic field will balance the dwell times and thereby remove the cause of ripple. If the ripple is due at least in part to an imbalance in inductances and capacitances in the input and output transformer circuits, as described hereinbefore, the dwell times of the transfer contact are adjusted until an imbalance in the dwell times compensates for those imbalances in the input and output transformer circuits.

Figures 2, 3, 4:
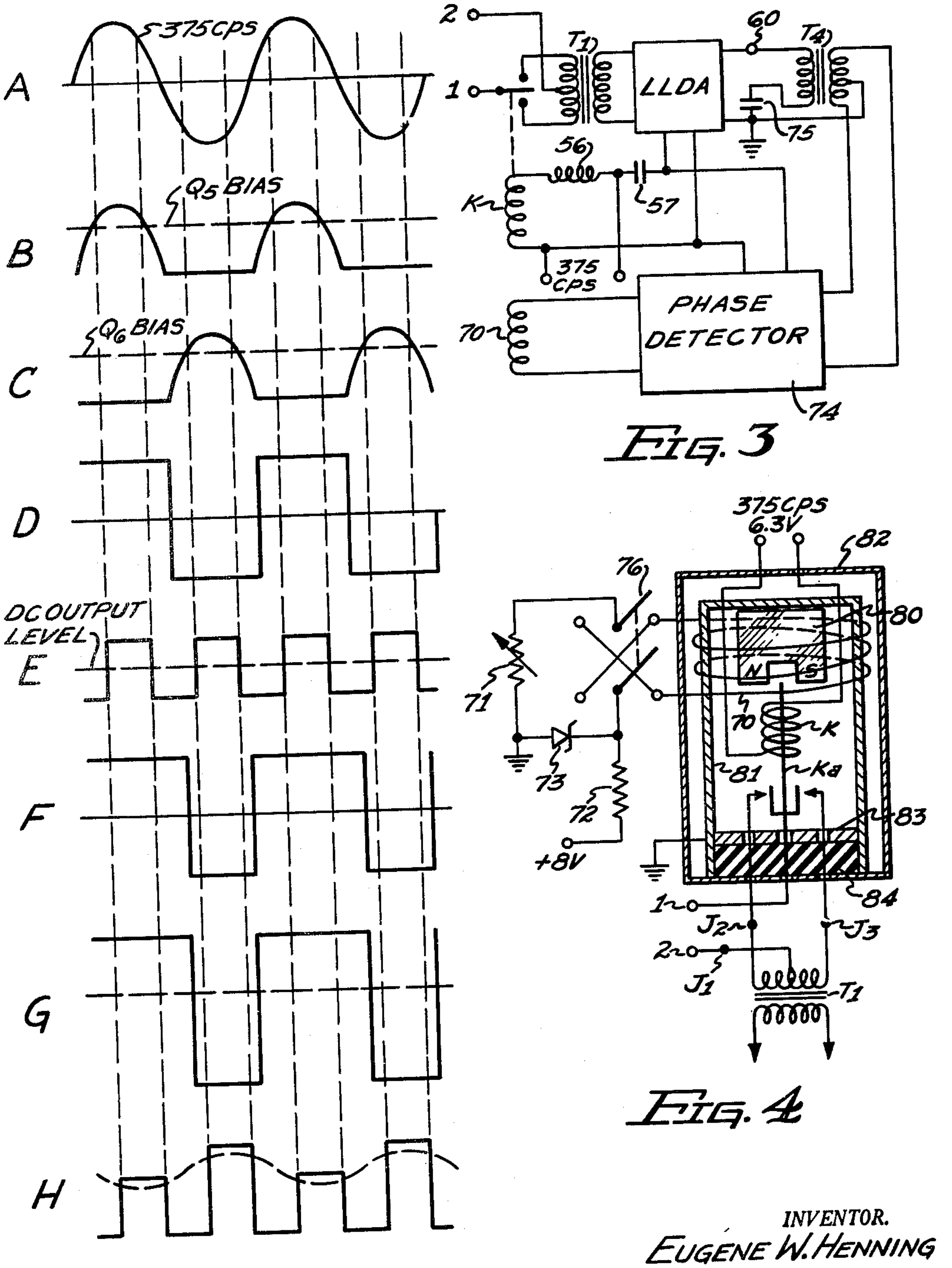

Other objects and advantages of the invention will become apparent from the following description with reference to the drawings in which:

FIG. 1 is a schematic diagram of an embodiment of the invention;

FIG. 2 displays waveforms which may be referred to for a complete understanding of the invention;

FIG. 3 is a schematic diagram partially in block diagram form of a system for automatically making an adjustment required in the present invention as described with reference to FIGS. 1 and 4; and FIG. 4 is a schematic diagram illustrating the physical arrangement of certain elements in one embodiment of the invention.

The illustrative embodiment of the invention in FIG. 1 comprises a low-level differential amplifier employing a synchronous vibrator for modulation. A low-level direct-current signal source, such as a strain gauge or thermocouple, is connected to input terminals 1 and 2. The input terminal 1 is connected to the transfer contact $K_a$ of the synchronous vibrator 3 and the input terminal 2 is connected to a center tap on a primary winding of an input transformer $T_1$. All of the junctions required to connect the input terminal 2 to the center tap of the input transformer are represented by a single junction $J_1$. The first and second contacts of the synchronous vibrator 3 are connected to respective ends of the primary winding of the input transformer $T_1$; the junctions necessary to make the connections are represented by a junction $J_2$ and a junction $J_3$. A 6.3 volt excitation signal alternating at 375 cycles per second is applied to an excitation coil K to alternately close two input circuits and thereby cause a low-level, D.-C. input signal connected to the input terminals 1 and 2 to be alternately conducted through the two halves of the primary winding of the input transformer $T_1$. The waveform of the voltage signal induced in the secondary winding of the input transformer $T_1$ is a substantially square wave, having an amplitude which is proportional to the amplitude of the input signal.

An amplifier comprising four direct-coupled, common-emitter transistor amplifier stages is employed to provide high gain and good A.-C. stability. A resistor 5 couples the input transformer $T_1$ to the base of the first transistor $Q_1$. A resistor 6 and a capacitor 7 filter high frequencies to prevent ringing in the secondary winding of the transformer $T_1$. A resistor 8 and a capacitor 9 provide bias through the secondary winding of the transformer $T_1$ in response to a feedback signal from the last stage. A resistor 10 couples the collector of the transistor $Q_4$ in the last stage to a negative feedback resistor 11 in the first stage to provide high gain stability for signals at 375 cycles per second. A capacitor 12 connected in parallel with the resistor 10 provides high-frequency stability over all four stages. Resistors 15, 16 and 17, and a voltage-regulating Zener diode 18, provide collector bias for the transistor $Q_1$. A resistor 19 and a voltage-regulating Zener diode 20 provide collector bias for the transistor $Q_2$.

The output of the first stage is directly coupled to the base of the transistor $Q_2$ in the second stage. A capacitor 21 and a resistor 22 provide high-frequency stabilization for the second stage.

Resistors 25 and 26, and a voltage-regulating Zener diode 27, provide collector bias for the transistor $Q_3$ in the third stage. A resistor 28 in the emitter circuit of the transistor $Q_3$, together with a resistor 29 and capacitor 30, provide high-frequency feedback to the third stage from the collector of the transistor $Q_4$ in the last stage for high gain stability.

The collector of the transistor $Q_3$ is directly connected to the base of the transistor $Q_4$. A resistor 37 in the emitter circuit of the transistor $Q_4$ and a capacitor 38 provide bias for the transistor $Q_4$. The feedback signal referred to hereinbefore is coupled to the base of the transistor $Q_1$ by a resistor 39. The output of the last stage is coupled from the collector of the transistor $Q_4$ to a demodulating circuit by an output transformer $T_2$. A variable resistor 40 is provided to adjust the gain of the amplifier over all four stages.

The demodulator consists of two transistor switches $Q_5$ and $Q_6$ which are alternately rendered conductive by the 375 cycle-per-second excitation signal coupled to their base electrodes by a transformer $T_3$ and a pair of current-limiting resistors 41 and 42. Diodes 43 and 44 connected in series with respective resistors 41 and 42 assure that current will flow through the base-to-emitter diodes of the transistors $Q_5$ and $Q_6$ alternately. Resistors 45, 46 and 47 and a voltage-regulating Zener diode 48 are provided to bias the transistors $Q_5$ and $Q_6$ below cutoff so that each will be rendered conductive only after the excitation signal alternately coupled to each reaches a predetermined amplitude. The reason for that is to accomplish demodulation by sampling the output signal transformer coupled from the last stage of the amplifier only during the center portion of each half of a modulating cycle. Waveform A in FIG. 2 represents two cycles of the excitation signal applied across the primary winding of the transformer $T_3$. Waveforms B and C of FIG. 2 illustrate the signals coupled to the respective switching transistors $Q_5$ and $Q_6$ for demodulation.

An output signal from the demodulating switch is derived from the center tap of the secondary winding and applied to a low-pass filter consisting of an inductor 49 and capacitors 50 to 52. That output signal is essentially a series of rectified pulses as represented by a waveform E in FIG. 2, one pulse for each half cycle of the signal represented by the waveform D applied to the primary winding of the transformer $T_2$ so that the fundamental frequency of the signal at the input of the filter circuit is 750 cycles per second, twice the fundamental frequency of the signal applied to the primary winding of the transformer $T_2$ which is the frequency of the excitation signal.

A resistor 53 is connected to a potentiometer 54 which is employed to provide a zero offset adjustment of the output signal at an output terminal 60 and thereby compensate for any error due to imbalances of contact and thermal potentials in the modulator as described hereinbefore.

Since the synchronous vibrator is a mechanical device electromagnetically actuated and the demodulator is a switch electronically operated, the latter responds to the excitation signal almost instantaneously and the synchronous vibrator lags behind the excitation signal by approximately 60 degrees. Therefore, in order to synchronize the demodulator with the synchronous vibrator, a delay of approximately 60 degrees is introduced in the excitation signal coupled by the transformer $T_3$ to the transistors $Q_5$ and $Q_6$ by a phase-shifting circuit consisting of an inductor 56 and a capacitor 57.

If there is an imbalance in the circuit capacitance and inductance in the two input circuits which are alternately closed by the transfer contack $K_a$ of the synchronous vibrator, the primary winding of the input transformer will effectively have a signal across it which is not symmetrical as shown by the waveform F in FIG. 2. Consequently, the signal induced in the secondary winding is unbalanced in amplitude as well as time, as shown by the waveform G in FIG. 2, for the reasons given hereinbefore.

A review of the waveforms A to H in FIG. 2 may serve to verify the statement made hereinbefore that an imbalance in dwell times produces unequal amplitudes in the two halves of a given cycle of the output signal from the A.-C. amplifier which is not distinguishable from the unequal amplitudes produced by imbalances in the inductances and capacitances of the two input circuits alternately closed by the synchronous vibrator. A dotted line on the waveform H shows that the output signal applied to the filter from the demodulating switches has an A.-C. component at a frequency of 375 cycles per second which produces a ripple in the D.-C. output signal. As noted hereinbefore, imbalances in the inductances and capacitances in the demodulator also produce a ripple in the D.-C. output signal.

Since the effect of an imbalance in the dwell times of the synchronous vibrator, an imbalance in the switching time of the transistors in the demodulator and an imbalance in the inductances and capacitances in the modulator and in the demodulator have been discovered to be similar in nature, the error produced by any type of imbalance may be corrected by affecting a selected one of the different types of imbalance. It is extremely difficult and impractical to try to adjust the imbalance of the inductances and capacitances in the modulator or the demodulator; therefore, in accordance with the present invention, the dwell-time imbalance is adjusted to correct the errors introduced by any imbalance in the modulator or demodulator, or both.

The correction for imbalances in either the modulator or demodulator is accomplished by adjusting a magnetic bias on the synchronous vibrator and thereby adjusting the dwell times of the transfer contact $K_a$ on the two contacts until sufficient compensation is introduced for any imbalance present. The magnetic bias is provided in the illustrative embodiment of the invention by a coil 70 having one terminal connected to a source of reference potential by a variable resistor 71 and its other terminal connected to a source of +8 volts by a resistor 72. A Zener diode 73 is connected between the resistor 72 and the source of reference potential in order to regulate the voltage across the coil 70 and resistor 71. The magnitude of the electromagnetic field produced by the coil is adjusted by varying the current through the coil 70 until the desired compensation is achieved for any imbalance present, which is until the undesired ripple in the D.-C. signal at the output terminal 60 is reduced to substantially zero volts in amplitude or until the error is reduced to tolerable limits.

If the polarity of the biasing field is such that the desired compensation cannot be achieved, the polarity of the biasing electromagnetic field may be reversed by simply reversing the connections between the coil 70 and the resistors 71 and 72, thereby reversing the direction of the current through the coil 70. If an automatic adjustment is required, a phase detector 74 coupled to the output signal of the low-level differential amplifier (LLDA) by a transformer $T_4$ may be employed as shown in FIG. 3. A capacitor 75 is connected in series with the primary winding of the transformer $T_4$ to prevent shunting the desired D.-C. signal at the output terminal 60 when the A.-C. component of the D.-C. output signal is transformer coupled to a phase detector in that manner. The phase-shifted excitation signal which operates the demodulating switches in the low-level differential amplifier is coupled to the phase detector 74 to provide a reference signal. The phase detector is preferably of the amplifying type but may be of any type, a group of which are described at pages 383 to 386 of Electronic Instruments, volume 21, The Radiation Laboratory Series, published by McGraw-Hill Book Co. (1948). Additional amplification may be provided as required for loop gain and stabilization by an amplifier connected between the transformer $T_4$ and the phase detector 74.

One manner in which the magnetic biasing field may be provided is by placing the coil 70 electromagnetically adjacent to the synchronous vibrator as schematically illustrated in FIG. 4. The synchronous vibrator illustrated is provided with a permanent magnet 80 having its north and south poles oppositely disposed with respect to the transfer contact $K_a$. As the coil K is excited by a 375 cycles-per-second modulating signal, the free end of the transfer contact is alternately polarized north and south, thereby causing it to move between the north and south poles of the magnet 80. When the free end of the transfer contact $K_a$ is polarized north, it is attracted toward the south pole of the magnet 80, thereby connecting the input terminal 1 to the junction $J_3$ for approximately half of a modulating cycle. During the second half of the modulating cycle, the free end of the transfer contact $K_a$ is attracted towards the north pole, thereby connecting the input terminal 1 to the junction $J_2$.

If the synchronous vibrator is perfectly balanced, the dwell times of the transfer contact at the two contacts connected to the junctions $J_2$ and $J_3$ would be equal. To unbalance the dwell time of the synchronous vibrator in order to compensate for imbalances in inductances and capacitances in the modulator or demodulator, or both, a direct-current source is connected to the coil 70 to establish a biasing electromagnetic field which will bias the free end of the transfer contact north or south, depending upon the direction of the current through the coil 70, and thereby cause the dwell time to be longer at one contact than at the other. For instance, assume that the sense of the current through the coil 70 is such that the electromagneic field biases the free end of the transfer contact $K_a$ north; in the absence of an excitation signal through the coil K, the transfer contact will be attracted by the south pole of the magnet 80, thereby connecting the input terminal 1 to the junction $J_3$. When the excitation signal is applied to the coil K, the half cycle of the excitation signal which tends to polarize the free end of the transfer contact south will cause it to move through the biasing field to the other contact and thereby produce a dwell time at the contact connected to the junction $J_2$ which is shorter than the dwell time at the contact connected to the junction $J_3$. The magnitude and direction of the current is adjusted until an imbalance in the dwell times is established which will just compensate for imbalances in the inductances and capacitances of the modulator and demodulator. The magnitude may be manually adjusted by the variable resistor 71, as noted hereinbefore, and the direction of the current reversed by a double-pole, double-throw switch 76, or both the magnitude and direction may be automatically adjusted by a servo system as described with reference to FIG. 3.

If only an imbalance in the dwell times is present to produce a ripple in the D.-C. output signal, the magnetic biasing field is adjusted until the synchronous vibrator is substantially balanced or until the ripple in the D.-C. output signal is reduced to a desired level. If both types of imbalances are present, the magnetic bias is adjusted until the imbalance in the dwell times just compensates for the imbalance in the inductances and capacitances in the modulator and demodulator.

It should be noted that although the means for magnetically biasing the synchronous vibrator is illustrated as a distinct coil connected to an adjustable source of direct current, the biasing means may comprise the source of adjustable direct current connected to the coil K. However, the provision of a distinct coil is preferred because othewise D.-C. blocking capacitors are required to isolate the source of the excitation signal from the source of direct current and A.-C. filters may be required to isolate the source of direct current from the source of excitation signals. The means for magnetically biasing the synchronous vibrator may also be a permanent magnet, the position and orientation of which may be varied to achieve the desired magnetic biasing field in the space through which the transfer contact vibrates.

The synchronous vibrator is preferably hermetically sealed by a cover 81, as are most commercially available synchronous vibrators, which functions as an electrostatic shield. The coil K is shown inside of the cover 81 but it may be outside as it is in some commercially available synchronous vibrators. The coil 70 is wound around the cover 81, either directly on the cover as shown or on a cylinder of non-conductive, non-magnetic material placed around the cover 81. The entire assembly is then preferably enclosed by a cover 82 of magnetic material to shield it from other magnetic fields. An electrostatic shield 83 is provided on top of a base 84 made of insulating material such as glass and the contacts of the synchronous vibrators are directly supported by the base 84.

It should be noted that the schematic diagram in FIG. 4 is only for the purpose of illustrating the relative disposition of the components and not for the purpose of illustrating a specific design nor for suggesting specific dimensions or proportions. For instance, the magnetic shield 82 is preferably made considerably larger than is suggested by the schematic diagram so that it will not appreciably affect the magnetic fields established within it. It should also be noted that the principles of the invention are applicable to all electromagnetic synchronous vibrators which may be employed.

While the principles of the invention have now been made clear in an illustrative embodiment, there will be immediately obvious to those skilled in the art many modifications in structure, arrangement, proportions, the elements, materials, and components, used in the practice of the invention, and otherwise, which are particularly adapted for specific environments and operating requirements, without departing from those principles. The appended claim is therefore intended to cover and embrace any such modifications, within the limits only of the true spirit and scope of the invention.

What is claimed is:

An amplifier for amplifying a direct current signal comprising a synchronous vibrator having a first contact, a second contact, and a transfer contact, a first transformer having a primary winding with a center tap and a secondary winding, means connecting said first and second contacts of said synchronous vibrator to said primary winding of said first transformer, means connecting the direct current signal to said transfer contact of said synchronous vibrator and to said center tap of said primary winding of said first transformer, an alternating current source producing an alternating current signal having a predetermined frequency, a first magnetic coil connected to said alternating current source and mounted on said synchronous vibrator to cause said transfer contact to alternatively engage and disengage said first and second contacts to modulate the direct current signal to an alternating current signal, an amplifier having a series of transistors, each transistor having a base, collector, and emitter electrodes, means connecting said secondary winding of said first transformer to the base of the first transistor of said amplifier, means connecting the collector of each transistor to the base of the succeeding transistor, a second transformer having a primary winding and a secondary winding with a center tap, means connecting the collector of the last transistor in said amplifier to said primary winding of said transformer, a demodulator having two transistors, each transistor having base, collector and emitter electrodes, means connecting said secondary winding of said second transformer to the collectors of said two transistors of said demodulators, means connecting the bases of said two transistors of said demodulators to said alternating current source to alternatively turn said transistors on and demodulate the signal amplified by said amplifier, a low pass filter connected to said center tap of said secondary winding of said second transformer for producing a series of rectified pulses, a phase shifting circuit having an inductance and a capacitor connected between said alternating current source and said demodulator to synchronize said synchronous vibrator and said demodulator, a direct current source, a second magnetic coil mounted on said synchronous vibrator connected to said direct current source for applying a magnetic field to said transfer contact, a third transformer having a primary winding and a secondary winding, means connecting the output circuit of said amplifier to said primary winding of said third transformer, a phase detector, means connecting said secondary winding of said transformer to said phase detector, and means connecting said second magnetic coil to said phase detector to control the magnetic field applied to said transfer contact for compensating for the imbalance of said synchronous vibrator and demodulator.

References Cited in the file of this patent

UNITED STATES PATENTS

| | | |
|---|---|---|
| 2,569,698 | Shepard | Oct. 2, 1951 |
| 2,572,794 | Wild | Oct. 23, 1951 |
| 2,959,727 | Wagner et al. | Nov. 8, 1960 |
| 2,960,585 | Russell | Nov. 15, 1960 |
| 3,018,444 | Offner | Jan. 23, 1962 |

OTHER REFERENCES

Article by Franklin Offner, Electronics, July 1, 1960, pages 55–57, "Transistorized Data Amplifier Has High Gain-Stability" (TK7800E58).